United States Patent [19] [11] 4,100,436
van de Plassche [45] Jul. 11, 1978

[54] CURRENT STABILIZING ARRANGEMENT

[75] Inventor: Rudy Johan van de Plassche, Eindhoven, Netherlands

[73] Assignee: U.S. Philips Corporation, New York, N.Y.

[21] Appl. No.: 732,360

[22] Filed: Oct. 14, 1976

[30] Foreign Application Priority Data

Oct. 21, 1975 [NL] Netherlands ......................... 7512311

[51] Int. Cl.$^2$ ............................................ H03K 17/00

[52] U.S. Cl. ................................ 307/296 R; 307/229; 307/297; 330/257

[58] Field of Search ....................... 307/296, 297, 229; 330/19, 30 D; 323/4, 9, 23

[56] References Cited

U.S. PATENT DOCUMENTS

| | | | |
|---|---|---|---|
| 4,013,973 | 3/1977 | van de Plassche | 330/30 D |
| 4,016,435 | 4/1977 | Voorman | 307/297 |
| 4,025,842 | 1/1976 | Crowle | 307/297 |

OTHER PUBLICATIONS

A Highly Precise Monolithic Current Controlled Current Source, Int. J. Electronics, 1974, vol. 37, No. 1., pp. 27–31.

*Primary Examiner*—Stanley D. Miller, Jr.
*Assistant Examiner*—B. P. Davies
*Attorney, Agent, or Firm*—Frank R. Trifari

[57] ABSTRACT

A current stabilizing arrangement includes a first and a second current circuit or path in which currents with a mutually fixed ratio are maintained. These currents respectively flow through the series connection of a first semiconductor junction in series with a resistor and a second semiconductor junction. The voltage across the second semiconductor junction is maintained equal to the voltage across said series connection, which results in currents which are linearly dependent on the temperature. In order to add a component with a positive second-order temperature dependence to these currents so as to enable a negative second-order temperature dependence to be compensated for in the case where the arrangement is used as a voltage or current reference source, the current stabilizing arrangement comprises a transistor whose base-emitter junction constitutes said second semiconductor junction, the base circuit of said transistor including a resistor.

8 Claims, 3 Drawing Figures

CURRENT STABILIZING ARRANGEMENT

Figure 1:
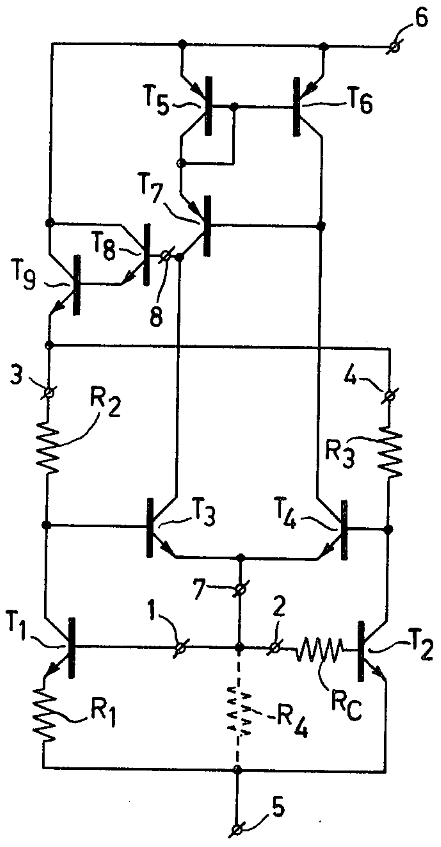

The invention relates to a current stabilizing arrangement comprising a first voltage control circuit connected between a first point and a first common point, which circuit includes the series connection of a first forward biassed semiconductor junction and a first impedance, a second voltage control circuit connected between a second point and the first common point, which circuit includes a second forward biassed semiconductor junction, which second semiconductor junction together with the first junction is formed on one semiconductor substrate by means of integration techniques, a first current circuit or path formed between a third point and the first common point, which circuit also includes said series connection, a second current circuit or path formed between a fourth point and the first common point, which circuit also includes the second semiconductor junction, a first means for maintaining currents in a mutually fixed ratio in the first and the second current circuit, which ratio is such that the arrangement has a stable state for which currents flow in bath current paths, and a second means for maintaining equal voltages across the first and the second voltage control circuits, the second semiconductor junction being the base-emitter junction of a first transistor whose base is connected to the second point and whose main current path is included in the second current circuit (path).

Such a current stabilizing arrangement is known, inter alia, from the U.S. Pat. No. 3,914,683. In this current stabilizing arrangement equal voltages are maintained across the first and the second voltage control circuits in that the first and the second points are interconnected. These points are each connected to the base electrodes of a transistors whose base-emitter junctions constitute the first and the second semiconductor junctions respectively, and whose main current paths are included in the first and the second current circuits respectively. One of the transistors may then be connected as a diode by means of a collector-base interconnection. The fixed proportion can then be maintained by a current mirror coupling between the two current circuits combined with control at the said interconnected base electrodes, or by the use of a differential amplifier, to the inputs of which voltages are applied which are produced across impedances which are included in the first and the second current circuits, an output of said differential amplifier supplying a control signal to said interconnected base electrodes.

In a current stabilizing arrangement of the type mentioned in the preamble and described in the "IEEE Journal of Solid State Circuits", Vol. SC-8, No. 3, June 1973, pages 222 - 226, equal voltages are maintained across the first and the second voltage control circuits in that the first and the second points are respectively connected to the inverting and non-inverting input of a differential amplifier, the output of said differential amplifier being connected to the third and the fourth points. The third and the fourth points are each connected to the first and the second points respectively with a resistor which is included in the first and the second current circuits respectively. The transistor whose base-emitter junction forms the second semiconductor junction is then connected as a diode. The ratio of the values of the said resistors determines the mutual proportion of the currents flowing through the first and the second circuits.

The operation of current stabilizing arrangements of the type mentioned in the preamble is based on the fact that owing to the fixed proportion of the currents in the two current circuits a stable condition can be obtained only for a specific magnitude of these currents (unequal to zero). This is because owing to the fact that equal voltages are maintained across the first and the second voltage control circuits these currents must meet the requirement that the difference between the voltage across the second semiconductor junction and the voltage across the first semiconductor junction should equal the voltage across the impedance.

For the difference between the voltages across two semiconductor junctions, which semiconductor junctions are at substantially the same temperature in an integrated circuit and are highly identical apart from the geometry, it can be demonstrated that this difference equals $(kT/q)$ ln $n$, $k$ being Boltzmann's constant, $T$ the absolute temperature (K), $q$ the elementary charge, and $n$ the ratio of the current densities of the two currents through the semiconductor junctions, which ratio is determined by the proportion of the currents through the two semiconductor junctions and the geometry ratio. If the impedance has a resistance value R and the current I through this impedance around the temperature $T = T_o$ is expanded in a Taylor series, this current will be $I = I_o[1 + (\Delta T/T_o)]$, in which $I_o = (kT_o/qR)$ ln $n$, and $T = T_o[1 = (\Delta T/T_o)]$.

It follows from the above that the currents which flow through the first and the second current circuits around $T = T_o$ have a temperature independent component and a component with a positive first-order temperature dependence. The current appearing at the common point may then also have a similar temperature dependence.

Said U.S patent states that by the addition of a resistor of suitable resistance value in parallel with the second semiconductor junction a substantially temperature-independent current (first-order temperature coefficient substantially equal to zero) is available at the common point. This is because the current through this resistor is proportional to the voltage across the second semiconductor junction, through which semiconductor junction a current flows which is proportional to the temperature. For the voltage across such a semiconductor junction it can be demonstrated that this voltage aroung $T = T_o$ has a temperature independent component and a component with a negative first-order temperature dependence. The current produced in the resistor by this first-order component can then compensate for the positive first-order component of the currents which flow in the two current circuits, so that a substantially temperature independent current is obtained.

Said U.S. patent also gives an example of the voltage equivalent of such a temperature independent current source. For this purpose the current which is produced, with a constant and a positive first-order component, is passed through the series-connection of a semiconductor junction and a resistor. The voltage component with a positive first-order temperature dependence which is produced across this resistor can then compensate for the component of the voltage across said semiconductor junction with a negative first-order dependence. It can be demonstrated that the voltage across said resistor in series with said semiconductor junction substantially equals $E_{gap}$, the gap between the conduction and valence band of the semiconductor material which is used. (For the equivalent current source the current then substantially equals Egap/R, R being the parallel resistance). In the circuit arrangement in accordance with the cited article in "IEEE J.S.S.C." the series connection of the resistor and semiconductor junction already forms part of the current stabilizer and the voltage Egap appears across the output of the differential amplifier and the first common point.

However, measurements and calculations (see said article) have revealed that the resulting reference current or voltage has a comparatively small component with a negative second-order temperature dependence (proportional to $(\Delta T/T_o)^2$), so that the output current or voltage of the reference source exhibits a deviation from the desired constant value, which deviation is a parabolic function of the temperature.

It is an object of the invention to provide a current stabilizing arrangement of the type mentioned in the preamble, in which the said deviation can be suppressed to a high egree in the case of use in for example a reference current or voltage source.

For this, the invention is characterized in that a resistor is included between the base of the first transistor and the second point.

The invention is based on the recognition that the inclusion of a resistor in the base circuit of the first transistor, inter alia owing to the temperature dependence of the base current, gives rise to an additional temperature dependent voltage drop in the second voltage control circuit, which additional voltage drop, as appears from measurements and calculations, gives rise to a component of the currents through the two current circuits with a positive second-order temperature dependence, which component may be employed for suppressing said deviation in reference sources of the said type to a high degree. As the resistor is included in the base circuit, through which a comparatively small current flows, this resistor hardly affects the principal components (constant and first-order component) of the currents in the two current circuits. However, if desired, allowance may be made for this small influence when designing said reference sources.

Figure 2:
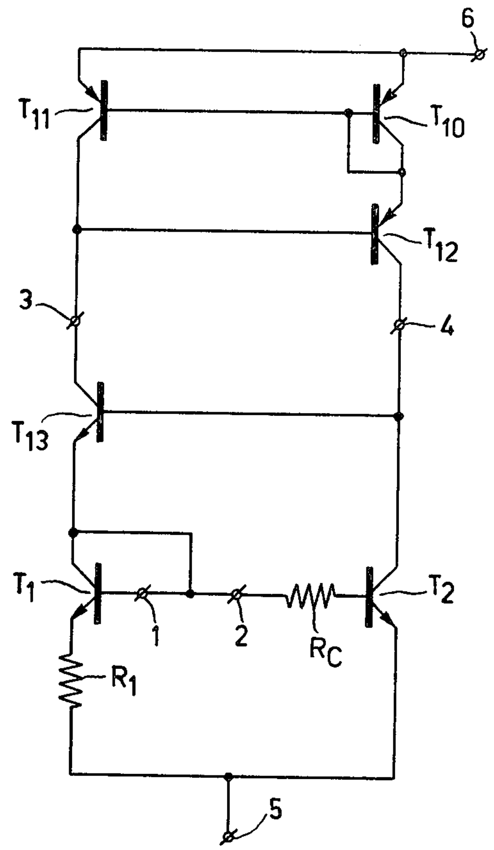
Figure 3:
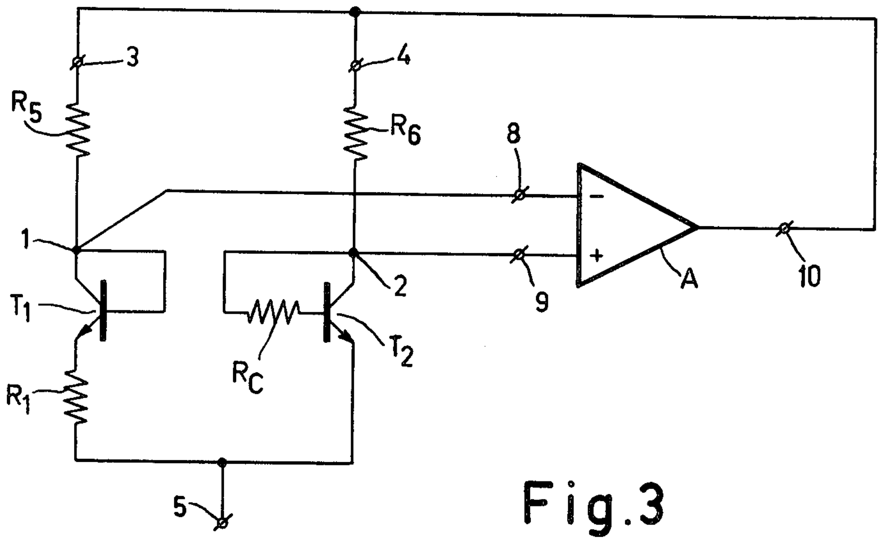

The invention will be described in more detail with reference to the accompanying drawing, in which:

FIG. 1 shows a first, and also preferred, embodiment of a current stabilizing arrangement in accordance with the invention, FIG. 2 shows a second embodiment, and FIG. 3 shows a third embodiment.

FIG. 1 shows a current stabilizing arrangement known from the said U.S. patent, to which the step in accordance with the invention has been applied (the resistor $R_c$). Between the first point 1 and the common point 5 the voltage control circuit includes the series connection of the base-emitter junction of transistor $T_1$ and a resistor $R_1$, and between the point 2 and the common point 5 the second control circuit includes the series connection of the resistor $R_c$ and the base-emitter junction of transistor $T_2$. Points 1 and 2 are connected directly. The collector circuits of the transistors $T_1$ and $T_2$ include the resistors $R_2$ and $R_3$ respectively. The collectors of the transistors $T_1$ and $T_2$ are also connected to the bases of the transistors $T_3$ and $T_4$ respectively. The transistors $T_3$ and $T_4$ are connected as a differential pair, the interconnected emitters being connected to points 1 and 2. The differential amplifier formed by transistors $T_3$ and $T_4$ has a differential output 8 in that the collectors of the transistors $T_3$ and $T_4$ are coupled with a current mirror consisting of the transistors $T_5$, $T_6$ and $T_7$. Via a transistor combination $T_8$, $T_9$, which is connected as an emitter follower, this output 8 is connected to the interconnected ends 3 and 4 of the resistors $R_2$ and $R_3$.

If the resistor $R_c$ were not present, the operation is as follows. Assuming that the voltage across the resistor $R_2$ exceeds the voltage across the resistor $R_3$, the collector current of transistor $T_3$ will become smaller than the collector current of transistor $T_4$, so that the base current of transistor $T_8$ and thus the sum of the currents through points 3 and 4 will increase. The increase of the currents through the resistors $R_2$ and $R_3$ initially causes an increase of the base currents of the transistors $T_3$ and $T_4$ and thus an increase of the tail current of the differential pair $T_3$, $T_4$. This increase of the tail current causes the voltage at the bases of the transistors $T_1$ and $T_2$ to increase, resulting in increasing collector currents. This mechanism controls the collector currents of the transistors $T_1$ and $T_2$ until the voltages produced across the resistors $R_2$ and $R_3$ by these collector currents are equal. For each temperature there is a value for these currents, which currents should also satisfy the requirement that the voltages across the two voltage control circuits are equal, for which this stable setting is obtained. Hence, the proportion of the collector currents of the transistors $T_1$ and $T_2$ equals the proportion of the resistances $R_3$ and $R_2$. In this respect it is to be noted that the common emitter circuit of the transistor $T_3$ and $T_4$ in this configuration constitutes an output of the differential amplifier, the bases of the transistors $T_3$ and $T_4$ forming an inverting and non-inverting input respectively.

For the emitter current $I_1$ of transistor $T_1$ the equation:

$$I_1R_1 = Vbe_2 - Vbe_1 = \Delta Vbe \qquad (1)$$

is valid, $Vbe_2$ and $Vbe_1$ being the base-emitter voltages of transistors $T_2$ and $T_1$ respectively. For the difference voltage $\Delta Vbe$ it is true that:

$$Vbe = (kT/q) \ln n$$

where $k$ is Boltzmann's constant, $q$ is the elementary charge, $T$ the absolute temperature, and $n$ the ratio of the current densities in the base-emitter junctions of the transistors $T_2$ and $T_1$. This ratio is proportional to the ratio of the resistances $R_2$ and $R_3$ and proportional to the ratio of the effective base-emitter areas of the transistors $T_1$ and $T_2$.

For the current $I_t$ which flows to a supply terminal via point 5 the following equation applies:

$$I_t = I_o[1 + (\Delta T/T_o)] \qquad (2)$$

where $I_o$ equals the current $I_t$ for a reference temperature $T_o$ and $\Delta T$ equals $T - T_o$.

If, as shown dashed in FIG. 1, a resistor $R_4$ is connected in parallel with the base-emitter junction of transistor $T_2$, a current $I_4 = Vbe_2/R_4$ will flow through this resistor $R_4$. For the base-emitter voltage of a transistor through which a current in accordance with expression (2) flows it can be demonstrated (see said article in "IEEE J.S.S.C.") that this voltage comprises a temperature independent component and a component with a negative first-order temperature dependence. At a suitable value of the resistor $R_4$ the component of the current $I_4$ as a result of this first-order component is compensated for by the first-order component of the current $I_t$ in accordance with expression (2). The total current which flows through point 5 is then substantially temperature independent and substantially equal to $Egap/R_4$.

A voltage reference source is obtained by passing the current $I_t$ in accordance with expression (2) through the series connection of a resistor $R_4$ and a semiconductor junction. The voltage across the series connection then substantially equals Egap for a correct value of the resistor $R_4$.

Accurate calculations of the voltage across a semiconductor junction through which a current in accordance with expression (2) flows have revealed that this voltage has a comparatively small component with a negative second-order temperature dependence, i.e. proportional to $(\Delta T/T_o)^2$. This component gives rise to a deviation from the desired reference current or voltage of approximately 4 ppm/° C, for example a variation of 0.4 μA over a temperature range of 100° C for a current of 1 mA.

In accordance with the invention said deviation can be compensated for to a high degree by adding a component with a positive second-order temperature dependence to the current in accordance with expression (2), which is achieved by the inclusion of the resistor $R_c$. Expression (1) then becomes:

$$I_t R_1 = \Delta Vbe + V_c \qquad (3)$$

where $V_c$ is the voltage produced across the resistor $R_c$ by the base current of transistor $T_2$. In comparison with the base-emitter voltage of transistor $T_2$ this voltage $V_c$ is much smaller than in comparison with $\Delta Vbe$, so that this voltage $V_c$ hardly influences the current through the resistor $R_4$. Measurements related to the current stabilizing arrangement in accordance with FIG. 1, in which the resistors $R_1$, $R_2$, $R_3$ and $R_4$ take the form of temperature-independent resistors, $R_2 = R_3$, $R_1 = 150$ ohms, $R_4 = 1250$ ohms, $n = 4$, $I_t = 1$ mA, and $R_c$ is an integrated resistor with a value of approx. 150 ohms at 390° C, revealed a deviation of 0.5 ppm/° C, i.e. a variation of 0.05 μA over a temperature range of 100° C for a current of 1 mA. This is an improvement by approximately a factor of 10. In this respect it is to be noted that measurements have shown that a compensation can also be achieved with a temperature independent resistor $R_c$. The experimental results are then found to be in agreement with computations.

The optimum value of the resistor $R_c$ depends on the properties of the transistors $T_1$ and $T_2$, the value of $n$, and the values of the resistors $R_1$ and $R_4$, and, as the case may be their temperature behaviour, so that for any other embodiment the most suitable value of the resistor $R_c$ is to be determined experimentally or theoretically.

The results obtained for the current reference source simply also apply to the use of the current stabilizing arrangement in a voltage reference source, because the voltage reference source is the voltage equivalent of the current reference source.

It is evident that the step in accordance with the invention may also be applied to other forms of the current stabilizing arrangement in accordance with FIG. 1. Indeed, for all modifications it is true that the voltage across a resistor in series with a semiconductor junction is assumed to equal the voltage across another semiconductor junction, while the currents in the two current circuits are in a mutually fixed proportion, i.e. in all modifications the currents are dictated by the same mechanism. For the sake of clarity two modifications are shown in FIGS. 2 and 3.

In the current stabilizing arrangement in accordance with FIG. 2 the ratio of the currents circuits 3 – 5 and 4 – 5 is defined by a current mirror $T_{10}$, $T_{11}$, $T_{12}$. Between points 1 and 5 the arrangement includes the series connection of the base-emitter junction of transistor $T_1$, which is connected as a diode by means of a collector-base interconnection, and the resistor $R_1$, and between the points 2 and 5 the series connection of the compensation resistor $R_c$ and the base-emitter junction of transistor $T_2$. Transistor $T_{13}$ has been added both to reduce the supply voltage dependence and to compensate for the base current of transistor $T_2$. The base current of transistor $T_2$ flows from the first current circuit (3–5) to the second current circuit (4–5), whereas the base current of transistor $T_{13}$ flows in the opposite direction.

Expression (3) is also valid for this current stabilizing arrangement so that by means of the resistor $R_c$ a component with a positive second-order temperature dependence can be added to the currents in the two current circuits.

In the form shown the arrangement of FIG. 2 is not suitable as a temperature independent current source because, owing to the collector-base connection of transistor $T_1$, no resistor should be included between point 2 and point 5. For this purpose the collector-base connection of transistor $T_1$ must be replaced by a connection via the base-emitter path of an additional transistor.

FIG. 3 shows a current stabilizer known from the article in the "IEEE J.S.S.C." cited in the introduction, to which the step in accordance with the invention has been applied. The current stabilizing arrangement again includes the series connection of the base-emitter junction of transistor $T_1$ and the resistor $R_1$ between points 1 and 5, and the series connection of the compensation resistor $R_c$ and the base-emitter junction of transistor $T_2$ between points 2 and 5. Transistor $T_1$ is connected as a diode by a collector-base interconnection and transistor $T_2$ by a collector-base connection via the resistor $R_c$. Points 1 and 2 are connected to the inverting input 8 and the non-inverting input 9 respectively of a differential amplifier A whose output 10 is connected to point 1 via a resistor $R_5$ and to point 2 via a resistor $R_6$.

The differential amplifier controls the currents through the first (3–5) and the second (4–5) current circuit. When the differential amplifier A is connected as shown in FIG. 3, a stable point is reached for any temperature. If the gain factor of the differential amplifier A is sufficiently high, the voltage difference between points 1 and 2 is then substantially O V. Thus, the requirements is satisfied that the voltages across the points 1 and 5 and across the points 2 and 5 are equal. As the voltages across the resistors $R_5$ and $R_6$ are equal, the ratio of the current in the current circuit 3–5 and the current in the current circuit 4–5 equals the ratio of the resistances $R_6$ and $R_5$, thus satisfying the requirement that the two currents should be in a mutually fixed proportion.

The currents which flow through the two current circuits in this current stabilizing arrangement are consequently also governed by expression (3).

To realize a voltage reference source the current stabilizing arrangement in accordance with FIG. 3 is particularly suitable because, for example the current circuit (4–5) already includes the series connection of a semiconductor junction ($T_2$) and a resistor ($R_6$), while the value of this resistor may be selected freely provided that the ratio of the values of the resistors $R_5$ and $R_6$ remains constant. If the value of the resistor $R_6$ is selected so that the component of the voltage across the "diode" $T_2$ with a negative first-order temperature dependence is compensated for, the voltage across point 10 and point 5 substantially equals Egap. The resistor $R_c$ provides a second-order compensation.

In the current stabilizing arrangement of FIG. 3 and in all other modifications it is possible, when required, to include more diodes or transistors connected as diodes in the emitter circuits of the transistors $T_1$ and $T_2$, provided that the number of semiconductor junctions in the first (1–5) and second (2–5) voltage control circuits are equal. It is also possible to add a resistor in the emitter circuit of transistor $T_2$. However, the voltage across the resistor $R_1$ should then be higher than the voltage across this additional resistor because the difference between these voltages equals the positive difference between the voltages across the base-emitter junctions of the transistors $T_2$ and $T_1$ (plus the voltage across the resistor $R_c$).

What is claimed is:

1. A current stabilizing arrangement comprising a first voltage control circuit connected between a first point and a first common point, which circuit includes the series connection of a first forward biassed semiconductor junction and a first impedance element, a second voltage control circuit connected between a second point and said first common point, which circuit includes a second forward biassed semiconductor junction, the first and second semiconductor junctions being formed on one semiconductor substrate, a first current path connected between a third point and the first common point, which path also includes said series connection of a first semiconductor junction and a first impedance element, a second current path connected between a fourth point and the first common point, which path also includes the second semiconductor junction, a first means for maintaining currents in a mutually fixed ratio in the first and the second current paths so that the arrangement has a stable state for which currents flow in both current paths, and a second means for maintaining equal voltages across the first and the second voltage control circuits, the second semiconductor junction being the base-emitter junction of a first transistor whose main current path is included in the second current path, and a resistor connected between the base of the first transistor and the second point.

2. A current stabilizing arrangement as claimed in claim 1, characterized in that the second means comprises a direct interconnection between the first and the second point, that the first semiconductor junction comprises the base-emitter junction of a second transistor whose base is connected to the first point and whose main current path is included in the first current path, that the first and the second current paths include second and third impedance elements respectively between the collectors of the second and the first transistors respectively and a second common point, and that the first means comprises a differential amplifier having an inverting and a non-inverting input, the inverting input being connected to an end of the second impedance element which is remote from the second common point and the non-inverting input being connected to an end of the third impedance element which is remote from the second common point, and means for applying an output signal of the differential amplifier to the first and second points.

3. A current stabilizing arrangement as claimed in claim 1, characterized in that the second means comprises a direct interconnection between the first and the second point, and that the first means comprises a current mirror circuit having an input and an output, which current mirror circuit mutually couples the first and the second current paths, except for the parts which are in common with the first and the second voltage control circuits respectively, and a low-ohmic coupling provided between the first and the second points and the output of the current mirror circuit.

4. A current stabilizing arrangement as claimed in claim 2 further comprising a fourth impedance element connected between the second point and the emitter of the first transistor.

5. A current stabilizing arrangement as claimed in claim 1 wherein the second point is connected to the collector of the first transistor and the first and the second means comprise a differential amplifier having an inverting input connected to the first point, a non-inverting input connected to the second point, and an output connected to the first and the second points respectively via second and third impedance elements respectively.

6. A current stabilizing arrangement as claimed in claim 3 further comprising a second impedance element connected between the second point and the emitter of the first transistor.

7. A current stabilizing arrangement as claimed in claim 1 wherein said first impedance element comprises a passive impedance device.

8. A current stabilizing arrangement as claimed in claim 1 wherein said resistor is formed as a part of said one semiconductor substrate so as to exhibit a given temperature-dependent characteristic.

* * * * *